US012514088B2

(12) United States Patent
Mollard et al.

(10) Patent No.: US 12,514,088 B2
(45) Date of Patent: Dec. 30, 2025

(54) METHOD FOR PRODUCING A PIXEL OF AN OLED MICRO-SCREEN

(71) Applicant: COMMISSARIAT A L'ENERGIE ATOMIQUE ET AUX ENERGIES ALTERNATIVES, Paris (FR)

(72) Inventors: Laurent Mollard, Grenoble (FR); Tony Maindron, Grenoble (FR); Myriam Tournaire, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 366 days.

(21) Appl. No.: 17/287,411

(22) PCT Filed: Oct. 22, 2019

(86) PCT No.: PCT/FR2019/052516
§ 371 (c)(1),
(2) Date: Apr. 21, 2021

(87) PCT Pub. No.: WO2020/084250
PCT Pub. Date: Apr. 30, 2020

(65) Prior Publication Data
US 2021/0391562 A1    Dec. 16, 2021

(30) Foreign Application Priority Data

Oct. 24, 2018   (FR) ........................ 1859834

(51) Int. Cl.
*H10K 59/35*    (2023.01)
*H10K 59/12*    (2023.01)
(Continued)

(52) U.S. Cl.
CPC ........... *H10K 59/35* (2023.02); *H10K 59/351* (2023.02); *H10K 59/1201* (2023.02);
(Continued)

(58) Field of Classification Search
CPC ........ H10K 71/00; H10K 50/81; H10K 50/82; H10K 50/852; H10K 59/351; H10K 2102/101; H10K 59/35
See application file for complete search history.

(56) References Cited

U.S. PATENT DOCUMENTS 9,123,666 B2 *  9/2015  Kashiwabara .......... H10K 50/82
2011/0127500 A1 *  6/2011  Ko ........................ H10K 50/844
                                                              438/35
(Continued)

FOREIGN PATENT DOCUMENTS

CN       108122954 A     6/2018
EP       1 672 962 A1    6/2006
(Continued)

OTHER PUBLICATIONS

International Search Report issued on Feb. 17, 2020 in PCT/FR2019/052516 filed on Oct. 22, 2019, citing references AA-AL and AO therein, 2 pages.
(Continued)

*Primary Examiner* — Jay C Kim
*Assistant Examiner* — Oo K Lee
(74) *Attorney, Agent, or Firm* — Oblon, McClelland, Maier & Neustadt, L.L.P.

(57) ABSTRACT

A method for producing a pixel of an OLED microscreen includes the steps of: a) providing a substrate having a structured first electrode; b) forming a dielectric layer on the structured first electrode; c) forming openings in the dielectric layer such that the structured first electrode has free areas, d) forming a spacer layer that is transparent and conductive, and includes: a first part extending over the dielectric layer, and a second part extending over the free areas; e) removing the first part of the spacer layer; f) forming a stack of organic light-emitting layers that is configured to emit a white light; and g) forming a second
(Continued)

electrode on the stack; step d) being carried out such that the second part of the spacer layer has first, second and third thicknesses that are designed to allow, respectively, the transmission of red, green and blue light.

12 Claims, 4 Drawing Sheets

(51) Int. Cl.
  *H10K 59/80*    (2023.01)
  *H10K 102/00*    (2023.01)
  *H10K 102/10*    (2023.01)

(52) U.S. Cl.
  CPC ..... *H10K 59/80524* (2023.02); *H10K 59/876* (2023.02); *H10K 2102/101* (2023.02); *H10K 2102/351* (2023.02)

(56) References Cited

U.S. PATENT DOCUMENTS

| | | |
|---|---|---|
| 2011/0241038 A1 | 10/2011 | Kashiwabara et al. |
| 2013/0207138 A1 | 8/2013 | Kashiwabara et al. |
| 2014/0203245 A1 | 7/2014 | Gupta et al. |
| 2014/0332832 A1 | 11/2014 | Kashiwabara et al. |
| 2015/0280171 A1 | 10/2015 | Ko et al. |
| 2015/0295017 A1 | 10/2015 | Kashiwabara et al. |
| 2016/0293673 A1 | 10/2016 | Kashiwabara et al. |
| 2017/0102737 A1 | 4/2017 | Imamura et al. |
| 2017/0154932 A1 | 6/2017 | Kashiwabara et al. |
| 2018/0197923 A1 | 7/2018 | Kashiwabara et al. |
| 2019/0326358 A1 | 10/2019 | Kashiwabara et al. |

FOREIGN PATENT DOCUMENTS

| | | |
|---|---|---|
| JP | 2006-154169 A | 6/2006 |
| JP | 2011-119238 A | 6/2011 |
| JP | 2012-48992 A | 3/2012 |
| JP | 2013-161520 A | 8/2013 |
| JP | 2017-134425 A | 8/2017 |
| JP | 2017-162832 A | 9/2017 |
| WO | WO 2018/181391 A1 | 10/2018 |

OTHER PUBLICATIONS

Japanese Office Action issued on Jul. 4, 2023 in Japanese Patent Application No. 2021-522075 (submitting English translation only), 3 pages.

* cited by examiner

METHOD FOR PRODUCING A PIXEL OF AN OLED MICRO-SCREEN

TECHNICAL FIELD

The invention relates to the technical field of organic light-emitting diode (OLED) microscreens.

In particular, the invention is applicable to the manufacture of virtual-reality or augmented-reality headsets and glasses, camera viewfinders, head-up displays, pico-projectors, etc.

PRIOR ART

A pixel of a top-emitting organic light-emitting diode microscreen known from the prior art, in particular from document EP 1 672 962 A1, comprises, in succession:
- a substrate;
- a first electrode that is reflective in the visible spectrum and is formed on the substrate;
- a spacer layer that is formed on the first electrode;
- a stack of organic light-emitting layers that is configured so as to emit white light and is formed on the spacer layer,
- a second electrode that is semi-transparent in the visible spectrum and is formed on the stack; the first and second electrodes forming an optical resonator.

The spacer layer has first, second and third portions, the thicknesses of which are adjusted such that the optical resonator allows, respectively, the transmission of red, green and blue light from the white light emitted by the stack so as to define, respectively, red, green and blue sub-pixels.

Such a pixel from the prior art makes it possible to contemplate omitting color filters by virtue of the Fabry-Pérot optical resonator forming an interference filter. The range of filtered wavelengths is determined by the thicknesses of the first, second and third portions of the spacer layer, allowing the thickness of the optical cavity (delimited by the first and second electrodes) to be adjusted such that the optical resonator allows, respectively, the transmission of red, green and blue light from the white light emitted by the stack of organic light-emitting layers.

This type of filtering may be achieved in an analogous manner for a bottom-emitting microscreen. To simplify the terminology, reference will continue to be made to a resonator, even though the interference effects are much less in the case of bottom emission.

However, such a pixel from the prior art is not entirely satisfactory insofar as electronically controlling the red, green and blue sub-pixels is liable to lead to crosstalk phenomena between adjacent sub-pixels due to the presence of lateral electrical conduction between adjacent sub-pixels by the spacer layer and/or by conductive layers within the stack of organic light-emitting layers.

Disclosure of the Invention

The invention aims to completely or partially rectify the abovementioned drawbacks. To this end, one subject of the invention is a method for manufacturing a pixel of an organic light-emitting diode microscreen, comprising the successive steps of:
a) providing a substrate comprising a structured first electrode;
b) forming a dielectric layer on the structured first electrode;
c) forming openings in the dielectric layer, such that the structured first electrode has free areas, the openings being intended to receive red, green and blue sub-pixels;
d) forming a spacer layer that is transparent in the visible spectrum and is electrically conductive, and comprises:
  a first part extending over the dielectric layer, and
  a second part extending over the free areas of the structured first electrode, inside the openings;
e) removing the first part of the spacer layer;
f) forming a stack of organic light-emitting layers that is configured so as to emit a white light and comprises:
  a first part extending over the dielectric layer, and
  a second part extending over the second part of the spacer layer, inside the openings;
g) forming a second electrode on the stack of organic light-emitting layers so as to obtain an optical resonator with the first electrode;
step d) being carried out such that the second part of the spacer layer has first, second and third thicknesses in the openings that are designed such that the optical resonator allows, respectively, the transmission of red, green and blue light from the white light emitted by the stack of organic light-emitting layers.

Such a method according to the invention thus makes it possible to obtain a Fabry-Pérot optical resonator while at the same time significantly reducing the effects of crosstalk between the adjacent sub-pixels. This is made possible by virtue of:
(i) removing the first part of the spacer layer in step e),
(ii) burying the second part of the stack of organic light-emitting layers (that is to say the effective part located between the electrodes) inside the openings in step f).

Such a method according to the invention therefore makes it possible to dispense with lateral electrical conduction liable to be caused by the first part of the spacer layer and by the presence of conductive layers within the stack of organic light-emitting layers.

Such a method according to the invention furthermore makes it possible to guarantee the presence of the spacer layer on the edges of the structured first electrode, and thus to avoid edge effects. This is made possible by burying the second part of the spacer layer inside the openings in step d).

Definitions

The term "microscreen" is understood to mean a screen in which the area of each pixel is smaller than or equal to 30 μm by 30 μm.

The term "substrate" is understood to mean a self-supporting physical carrier, made of a base material preferably allowing the integration of an electronic device or an electronic component. For example, a substrate is conventionally a wafer cut from a monocrystalline ingot of semiconductor material.

The term "structured electrode" is understood to mean an electrode exhibiting a discontinuous surface delimiting a set of patterns.

The term "dielectric layer" is understood to mean a layer made of a dielectric material, having an electrical conductivity at 300 K of less than $10^{-8}$ S·cm$^{-1}$.

The term "free areas" is understood to mean areas of the first electrode that are not covered by the dielectric layer.

The term "visible spectrum" is understood to mean an electromagnetic spectrum between 380 nm and 780 nm.

The term "transparent" is understood to mean that the spacer layer has an intensity transmission coefficient greater than or equal to 70%, preferably greater than or equal to 80%, more preferably greater than or equal to 85% and even more preferably greater than or equal to 90% averaged across the visible spectrum.

The term "electrically conductive" is understood to mean that the spacer layer has an electrical conductivity at 300 K greater than or equal to $10^2$ S/cm.

The term "inside the openings" is understood to mean that the surface of the second part of the spacer layer is located at a level lower than that of the surface of the dielectric layer. Likewise, it is understood that the surface of the second part of the stack of organic light-emitting layers is located at a level lower than that of the surface of the dielectric layer.

The term "thickness" is understood to mean the dimension along the normal to the surface of the pixel or of the sub-pixel.

The method according to the invention may comprise one or more of the following features.

According to one feature of the invention, step e) is carried out such that the second part of the spacer layer and the dielectric layer have a step height greater than or equal to 100 nm at the end of step e).

The term "step height" is understood to mean the dimension—along the normal to the surface of the pixel—between the surface of the dielectric layer and the surface of the second part of the spacer layer.

One advantage afforded by such a step height is thus that of being able to significantly reduce the effects of crosstalk between the red, green and blue sub-pixels. Specifically, the lateral electrical conduction, liable to be caused by the presence of conductive layers within the stack of organic light-emitting layers, is greatly limited by virtue of this step height.

According to one feature of the invention, step e) is carried out through chemical-mechanical polishing.

One advantage that is afforded is thus the speed of the operation of removing the first part of the spacer layer.

According to one feature of the invention, the spacer layer formed in step d) comprises at least one oxide that is electrically conductive and transparent in the visible spectrum.

According to one feature of the invention, the oxide or oxides are selected from among indium tin oxide, tin oxide $SnO_2$ and zinc oxide ZnO.

According to one feature of the invention, step d) is carried out such that the first thickness is 100 nm, the second thickness is 50 nm, and the third thickness is 10 nm.

According to one feature of the invention, the openings formed in step c) have a width of between 500 nm and 10 μm.

According to one feature of the invention, the dielectric layer formed in step b) is made of a material chosen from among $SiO_2$ and SiN.

According to one feature of the invention, the dielectric layer formed in step b) has a thickness of between 150 nm and 300 nm.

One advantage that is afforded is thus that of combining both:
- a thickness large enough to achieve a satisfactory step height (typically greater than or equal to 100 nm) between the second part of the spacer layer and the dielectric layer after consumption of material due to the chemical-mechanical polishing carried out in step b);
- a thickness small enough so as not to unduly increase the formation time of the dielectric layer.

According to one feature of the invention, the first and second electrodes are made of a metal material, preferably selected from among Al, Ag, Pt, Cr, Ni, W, and/or made of a transparent conductive oxide.

Such metal materials exhibit both a high-intensity reflection coefficient in the visible spectrum and high electrical conductivity. Preference will be given to an oxide that is electrically conductive and transparent in the visible spectrum when the electrode has to be transparent or semi-transparent.

According to one feature of the invention, the substrate provided in step a) is transparent in the visible spectrum, the structured first electrode provided in step a) is semi-transparent in the visible spectrum, and the second electrode formed in step g) is reflective in the visible spectrum.

The term "transparent" is understood to mean that the substrate has an intensity transmission coefficient greater than or equal to 70%, preferably greater than or equal to 80%, more preferably greater than or equal to 85% and even more preferably greater than or equal to 90% averaged across the visible spectrum.

The term "semi-transparent" is understood to mean that the structured first electrode has an intensity transmission coefficient of between 30% and 70% averaged across the visible spectrum.

The term "reflective" is understood to mean that the second electrode has an intensity reflection coefficient greater than or equal to 70%, preferably greater than or equal to 80%, more preferably greater than or equal to 85% and even more preferably greater than or equal to 90% averaged across the visible spectrum.

One advantage that is afforded is thus that of obtaining what is known as a bottom-emitting structure, that is to say emitting through the substrate.

According to one feature of the invention, the substrate provided in step a) is made of a semiconductor material, preferably silicon, or made of glass, the structured first electrode provided in step a) is reflective in the visible spectrum, and the second electrode formed in step g) is semi-transparent in the visible spectrum.

The term "semiconductor" is understood to mean that the material has an electrical conductivity at 300 K of between $10^{-8}$ S·cm$^{-1}$ and $10^2$ S·cm$^{-1}$.

The term "reflective" is understood to mean that the structured first electrode has an intensity reflection coefficient greater than or equal to 70%, preferably greater than or equal to 80%, more preferably greater than or equal to 85% and even more preferably greater than or equal to 90% averaged across the visible spectrum.

The term "semi-transparent" is understood to mean that the second electrode has an intensity transmission coefficient of between 30% and 70% averaged across the visible spectrum.

One advantage that is afforded is thus that of obtaining what is known as a top-emitting structure, that is to say emitting through the second electrode. The substrate may then comprise a circuit for controlling the red, green and blue sub-pixels without impacting the luminous efficiency of the microscreen. A TFT (thin-film transistor) circuit will be chosen when the substrate is made of glass, and a CMOS (complementary metal-oxide semiconductor) circuit will be chosen when the substrate is made of a semiconductor material, in particular Si.

BRIEF DESCRIPTION OF THE DRAWINGS

Other features and advantages will become apparent from the detailed disclosure of various embodiments of the invention, the disclosure being accompanied by examples and references to the appended drawings.

Figure 1:
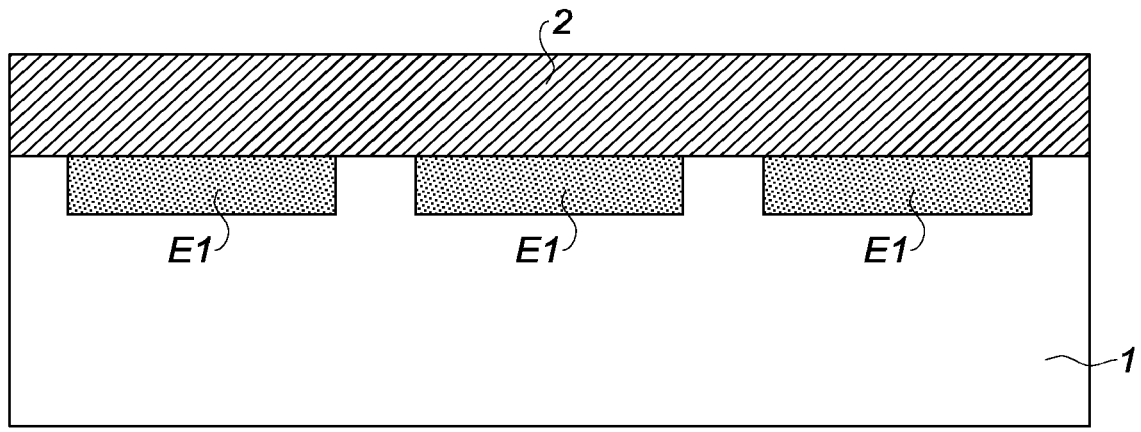
FIGS. 1 to 8 are schematic sectional views along the normal to the substrate, illustrating steps of a method according to the invention.

It should be noted that, for the sake of legibility and ease of understanding, the drawings described above are schematic and not to scale.

DETAILED DISCLOSURE OF THE EMBODIMENTS

For the sake of simplicity, elements that are identical or that perform the same function in the various embodiments will bear the same references.

As illustrated in FIGS. 1 to 8, one subject of the invention is a method for manufacturing a pixel of an organic light-emitting diode microscreen, comprising the successive steps of:
a) providing a substrate 1 comprising a structured first electrode E1;
b) forming a dielectric layer 2 on the structured first electrode E1;
c) forming openings 20 in the dielectric layer 2, such that the structured first electrode E1 has free areas ZL, the openings 20 being intended to receive red, green and blue sub-pixels PR, PV, PB;
d) forming a spacer layer 3 that is transparent in the visible spectrum and is electrically conductive, and comprises:
a first part 30 extending over the dielectric layer 2, and
a second part 31 extending over the free areas ZL of the structured first electrode E1, inside the openings 20;
e) removing the first part 30 of the spacer layer 3;
f) forming a stack 4 of organic light-emitting layers that is configured so as to emit a white light and comprises:
a first part 40 extending over the dielectric layer 2, and
a second part 41 extending over the second part 31 of the spacer layer 3, inside the openings 20;
g) forming a second electrode E2 on the stack 4 of organic light-emitting layers so as to obtain an optical resonator with the first electrode E1;
step d) being carried out such that the second part 31 of the spacer layer 3 has first, second and third thicknesses in the openings 20 that are designed such that the optical resonator allows, respectively, the transmission of red, green and blue light from the white light emitted by the stack 4 of organic light-emitting layers.

Figure 2:
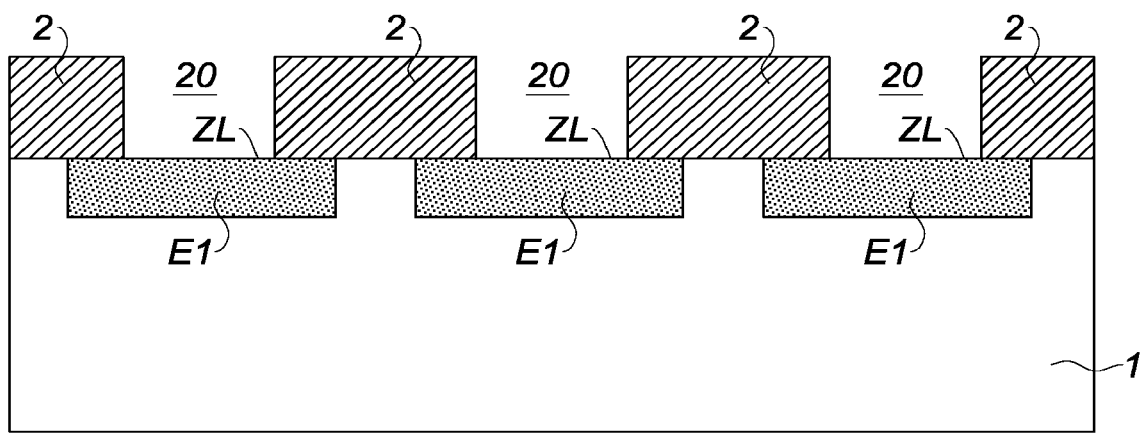
Figure 3:
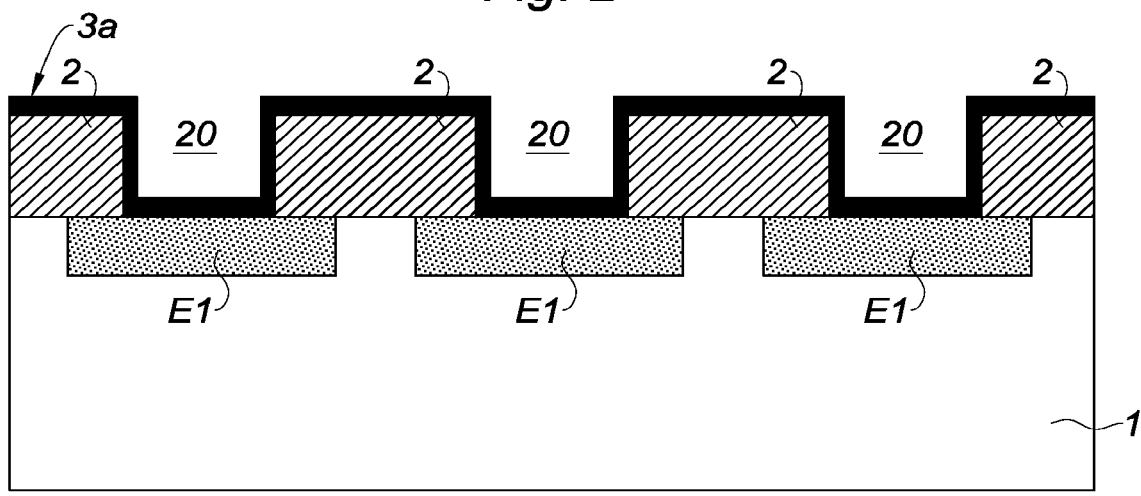
Figure 4:
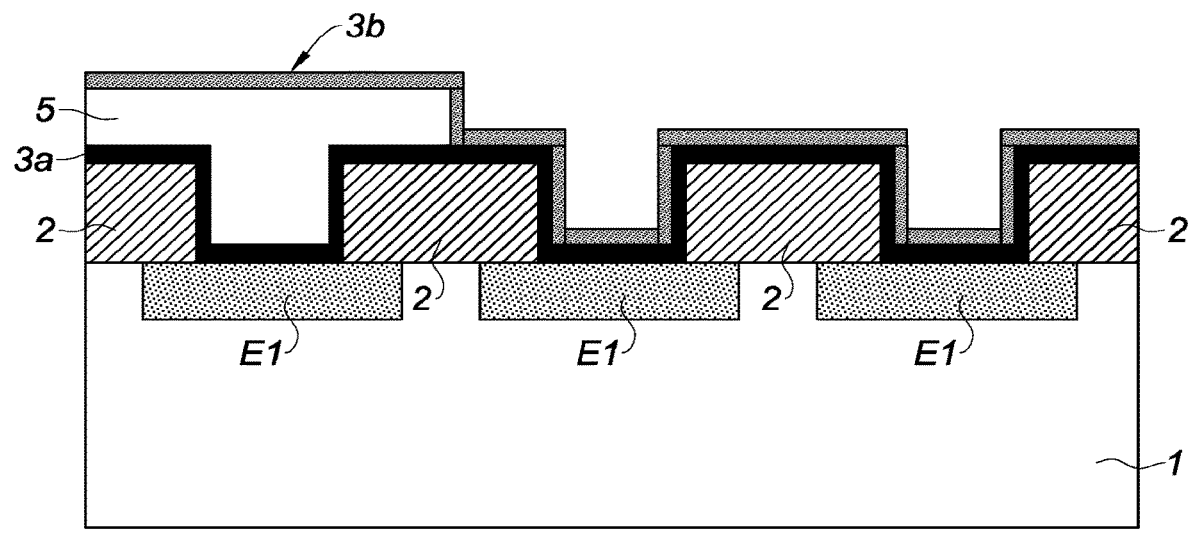
Figure 5:
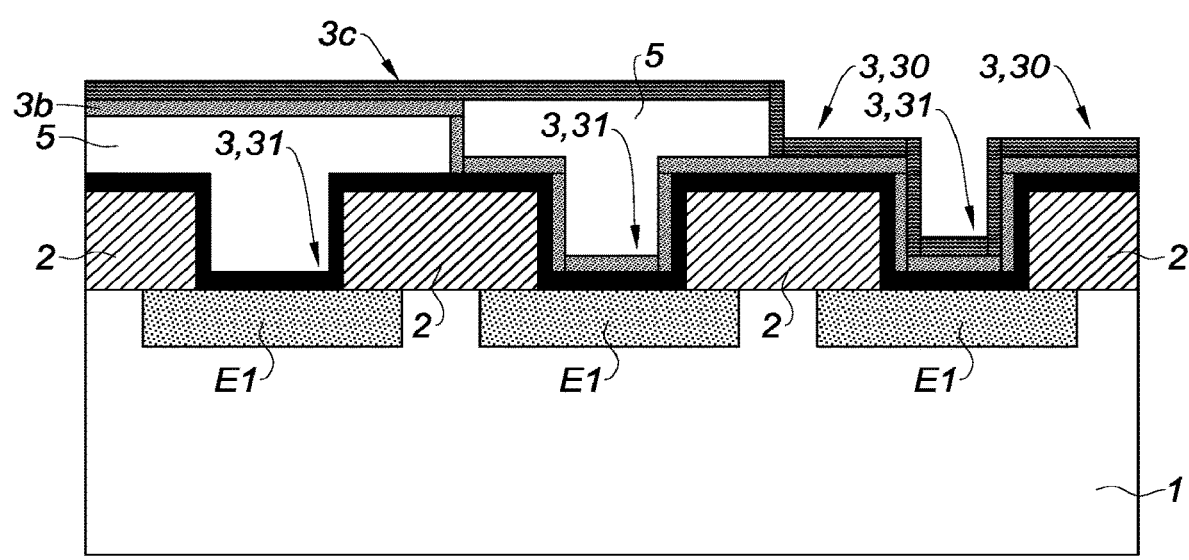
Figure 6:
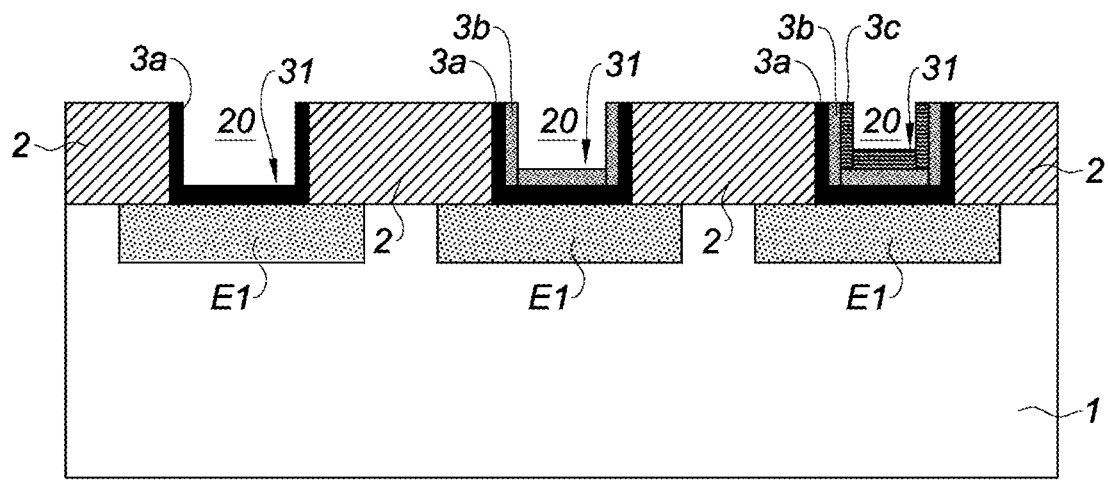
Figure 7:
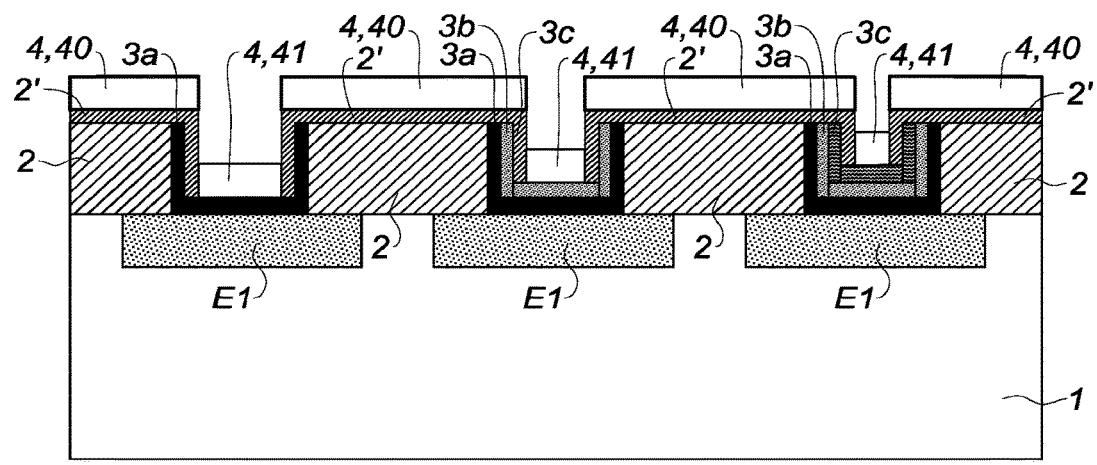
Figure 8:
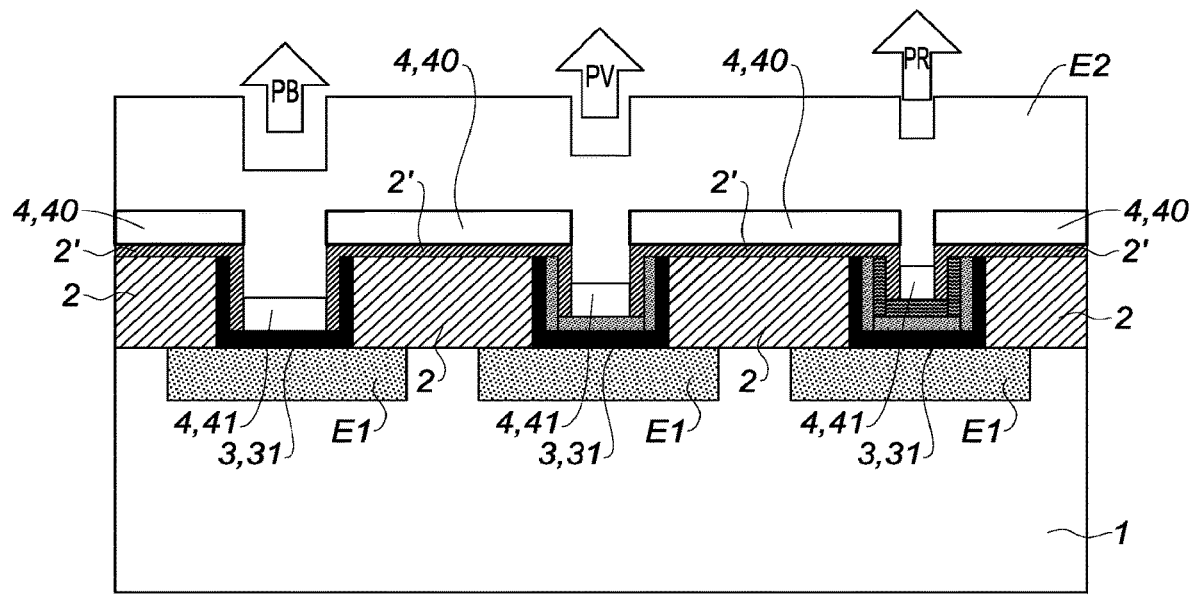

Steps a) and b) are illustrated in FIG. 1. Step c) is illustrated in FIG. 2. Step d) is illustrated in FIGS. 3 to 5. Step e) is illustrated in FIG. 6. Step f) is illustrated in FIG. 7. Step g) is illustrated in FIG. 8.

Substrate and Types of Architecture

According to a first architecture, known as a bottom-emitting architecture:
the substrate 1 provided in step a) is transparent in the visible spectrum, and may be made of glass,
the structured first electrode E1 provided in step a) is semi-transparent in the visible spectrum, and may for example be made of a transparent conductive oxide,
the second electrode E2 formed in step g) is reflective in the visible spectrum, and may for example be made of a metal material.

According to a second architecture, known as a top-emitting architecture:
the substrate 1 provided in step a) is made of a semiconductor material, preferably silicon, or made of glass,
the structured first electrode E1 provided in step a) is reflective in the visible spectrum, and may for example be made of a metal material,
the second electrode E2 formed in step g) is semi-transparent in the visible spectrum, and may for example be made of a transparent conductive oxide.

Structured First Electrode

The structured first electrode E1 is advantageously made of a metal material, preferably selected from among Al, Ag, Pt, Cr, Ni, W, or made of a transparent conductive oxide.

The first electrode E1 is preferably an anode. However, the first electrode E1 may be a cathode if the structure of the stack 4 of organic light-emitting layers is inverted.

Step a) may comprise the steps of:
$a_1$) providing the substrate 1;
$a_2$) depositing the first electrode E1 on the substrate 1 through blanket deposition, using a deposition technique known to those skilled in the art;
$a_3$) structuring the first electrode E1 through lithography.

The patterns of the structured first electrode E1 are preferably separated by a width of between 0.5 μm and 1 μm. This width makes it possible to obtain a pitch of a matrix-array of sub-pixels of a microscreen of preferably between 4 μm and 5 μm.

When the architecture is a bottom-emitting architecture, the structured first electrode E1 has a thickness designed to be semi-transparent in the visible spectrum. The first electrode E1 may then for example be made of a transparent conductive oxide (for example ITO).

When the architecture is a top-emitting architecture, the structured first electrode E1 has a thickness designed to be reflective in the visible spectrum. The first electrode E1 may then for example be made of a metal material.

Dielectric Layer

The dielectric layer 2 formed in step b) is advantageously made of a material chosen from among $SiO_2$ and SiN.

Step b) may be carried out using a deposition technique known to those skilled in the art.

The dielectric layer 2 formed in step b) advantageously has a thickness of between 150 nm and 300 nm.

Step c) may be carried out using an etching technique known to those skilled in the art so as to obtain etching sidewalls that are steep enough that the second part 31 of the spacer layer 3 and the dielectric layer 2 have a step height greater than or equal to 100 nm at the end of step e), in order to guarantee the discontinuity of the deposition of the stack 4 of organic light-emitting layers. The openings 20 formed in step c) advantageously have a width of between 500 nm and 10 μm. The openings 20 in the dielectric layer 2 may have a rectangular cross section. The term "cross section" is understood to mean a section taken along the normal to the surface of the pixel, that is to say in the thickness of the dielectric layer 2. As a variant, the openings 20 in the dielectric layer 2 may have a differently-shaped cross section, which would be beneficial to the extraction of light, for example a parabolic cross section.

Formation of the Spacer Layer

The spacer layer 3 formed in step d) advantageously comprises at least one oxide that is electrically conductive and is transparent in the visible spectrum (hereinafter referred to as TCO for transparent conductive oxide). The oxide or oxides are advantageously selected from among indium tin oxide, tin oxide $SnO_2$ and zinc oxide ZnO. The zinc oxide ZnO is preferably aluminum-doped. The tin oxide $SnO_2$ is preferably aluminum-doped. It is also possible to contemplate other derivatives of indium tin oxide, of tin oxide $SnO_2$ and of zinc oxide ZnO.

Step d) is carried out such that the second part 31 of the spacer layer 3 has the first, second and third thicknesses in the openings 20 intended to receive, respectively, the red, green and blue sub-pixels PR, PV, PB. To this end, step d) may comprise the successive steps of:
- $d_1$) depositing a first TCO 3a on the dielectric layer 2 and in the openings 20 in the dielectric layer 2;
- $d_2$) masking the openings 20 intended to receive the blue sub-pixels PB;
- $d_3$) depositing a second TCO 3b on the first TCO;
- $d_4$) masking the openings 20 intended to receive the green sub-pixels PV;
- $d_5$) depositing a third TCO 3c on the second TCO.

Step $d_1$) is illustrated in FIG. 3. Steps $d_2$) and $d_3$) are illustrated in FIG. 4. Steps $d_4$) and $d_5$) are illustrated in FIG. 5.

Steps $d_1$), $d_3$) and $d_5$) are carried out using deposition techniques known to those skilled in the art. Steps $d_2$) and $d_4$) may be carried out using a photosensitive resin 5. The first thickness of the second part 31 of the spacer layer 3 corresponds to the thickness of the first TCO 3a deposited in step $d_1$). The second thickness of the second part 31 of the spacer layer 3 corresponds to the sum of the thicknesses of the first and second TCO 3a, 3b deposited, respectively, in steps $d_1$) and $d_3$). The third thickness of the second part 31 of the spacer layer 3 corresponds to the sum of the thicknesses of the first, second and third TCO 3a, 3b, 3c deposited, respectively, in steps $d_1$), $d_3$) and $d_5$). It should be noted that the first, second and third TCO 3a, 3b, 3c may be made of identical or different materials.

Step d) is advantageously carried out such that the first thickness is 100 nm, the second thickness is 50 nm, and the third thickness is 10 nm. The values of these thicknesses are understood within the usual tolerances linked to the experimental deposition conditions, and not as being perfectly equal values within the mathematical sense of the term.

Removal of the Spacer Layer

Step e) is advantageously carried out such that the second part 31 of the spacer layer 3 and the dielectric layer 2 have a step height greater than or equal to 100 nm at the end of step e).

Step e) is advantageously carried out through chemical-mechanical polishing. Step e) is carried out so as to free up the surface of the dielectric layer 2. Moreover, such a step e) makes it possible to level out the surface of the dielectric layer 2.

Step e) may be accompanied by removal of part of the underlying dielectric layer 2 when the first part 30 of the spacer layer 3 has an excessively thin thickness.

The photosensitive resins 5 used in steps $d_2$) and $d_4$) remaining in the openings 20 are then removed after step e) using stripping techniques that are known to those skilled in the art.

Figure 6B:
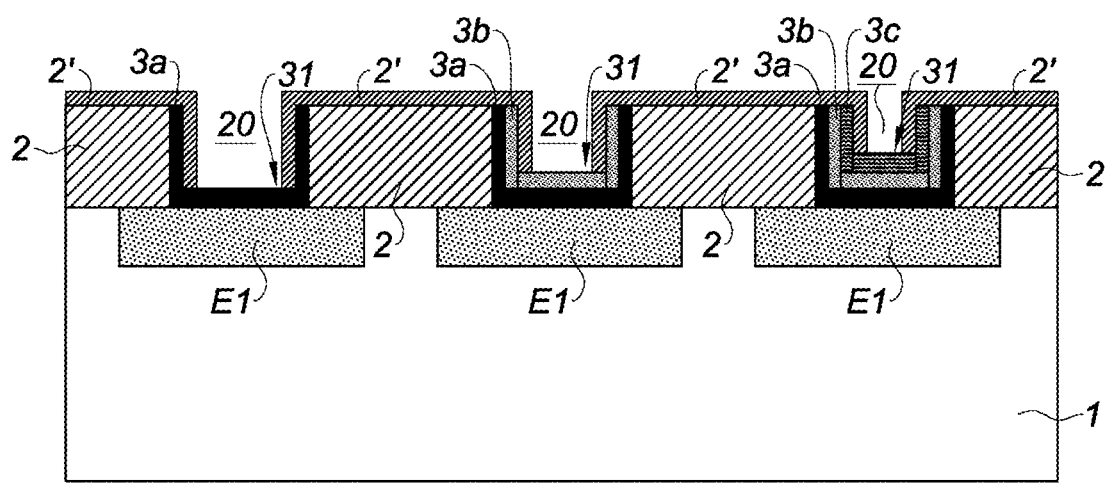

As illustrated in FIG. 6B, a dielectric film 2' is then advantageously formed on the free surface of the dielectric layer 2 and on the second part 31 of the spacer layer 3. By way of non-limiting example, the dielectric film 2' may be made of a material chosen from among Al2O3, HfO2, Ta2O5. The dielectric film 2' advantageously has a thickness of between 1 nm and 10 nm, preferably of between 1 nm and 5 nm. The dielectric film 2' may be formed through atomic layer deposition (ALD). The dielectric film 2' is then etched in the openings 20, at the bottom of the trench, so as to free up the second part 31 of the spacer layer 3. The dielectric film 2' is etched at the bottom of the openings 20 so as not to unduly reduce the dimensions of the red, green and blue sub-pixels PR, PV, PB, while at the same time guaranteeing an electrical insulation function. The etching of the dielectric film 2' in the bottom of the openings 20 may be carried out through lithography. The dielectric film 2' that is obtained is arranged so as to avoid a short circuit between the first and second electrodes E1, E2. Where appropriate, step f) is carried out such that the first part 40 of the stack 4 of organic light-emitting layers extends over the dielectric film 2'.

Stack of Organic Light-Emitting Layers

The stack 4 of organic light-emitting layers that is formed in step f) has a constant thickness for each red, green and blue sub-pixel PR, PV, PB.

By way of non-limiting example, the stack 4 may comprise three emissive layers in a tandem architecture. More precisely, when the structured first electrode E1 is an anode and the second electrode E2 is a cathode, the stack 4 may comprise:
- a first hole transport layer that is formed on the structured first electrode E1;
- a first emissive layer, emitting a blue light, that is formed on the first hole transport layer;
- a first electron transport layer that is formed on the first emissive layer;
- a charge generation layer (also known as an interconnect layer) that is formed on the first electron transport layer;
- a second hole transport layer that is formed on the charge generation layer;
- a second emissive layer, emitting a green light, that is formed on the second hole transport layer;
- a third emissive layer, emitting a red light, that is formed on the second emissive layer;
- a second electron transport layer that is formed on the third emissive layer and is intended to be coated with the second electrode E2.

As variants, the stack 4 may comprise:
- three emissive layers emitting, respectively, blue, green and red light without being arranged in a tandem architecture (conventional structure);
- two emissive layers emitting, respectively, yellow and blue light that are arranged in a conventional structure;
- two emissive layers emitting, respectively, yellow and blue light that are arranged in a tandem structure.

Step f) is carried out using deposition techniques known to those skilled in the art.

Second Electrode

The second electrode E2 is advantageously made of a metal material, preferably selected from among Al, Ag, Pt, Cr, Ni, W, or made of a transparent conductive oxide.

The second electrode E2 is preferably a cathode. However, the second electrode E2 may be an anode if the structure of the stack 4 of organic light-emitting layers is inverted.

Step g) is carried out using a deposition technique known to those skilled in the art. Step g) is preferably carried out through a sufficiently conformal deposition so as to guarantee the change in the step between the first and second parts 40, 41 of the stack 4 of organic light-emitting layers.

The second electrode E2 is advantageously coated with an encapsulation layer (not illustrated) designed to protect the second electrode E2 and the stack 4 of organic light-emitting layers from air and humidity.

When the architecture is a bottom-emitting architecture, the second electrode E2 has a thickness designed to be reflective in the visible spectrum. The second electrode E2 may then for example be made of a metal material.

When the architecture is a top-emitting architecture, the second electrode E2 has a thickness designed to be semi-transparent in the visible spectrum. The second electrode E2 may then for example be made of a transparent conductive oxide (for example ITO).

The invention is not limited to the disclosed embodiments. Those skilled in the art are able to consider the technically effective combinations of the embodiments and to replace them with equivalents.

The invention claimed is:

1. A method for manufacturing a pixel of an organic light-emitting diode microscreen, comprising:
   a) providing a substrate comprising a structured first electrode;
   b) forming a dielectric layer on the structured first electrode;
   c) forming openings in the dielectric layer, such that the structured first electrode has free areas, the openings being intended to receive red, green and blue sub-pixels;
   d) forming a spacer layer that is transparent in a visible spectrum, is electrically conductive, and includes:
      a first part extending over an upper surface of the dielectric layer and outside of the openings, and
      a second part extending over the free areas of the structured first electrode, inside the openings, so that an upper surface of the second part of the spacer layer is at a lower level than the upper surface of the dielectric layer;
   e) removing the first part of the spacer layer;
   e1) forming a dielectric film directly on a top surface of the dielectric layer;
   f) forming a stack of organic light-emitting layers that is configured so as to emit a white light, the stack of organic light-emitting layers includes:
      a first part positioned outside of the openings and directly on an upper planar surface of the dielectric film with respect to a light emitting direction of the white light, the upper planar surface facing in the light emitting direction, and
      a second part extending over the second part of the spacer layer, buried inside the openings, so that an upper surface of the second part of the stack of organic light-emitting layers is at a lower level than the upper surface of the dielectric layer, the first part and the second part of the stack of organic light-emitting diodes being discontinuous; and
   g) forming a second electrode on the stack of organic light-emitting layers, the second electrode being arranged to form an optical resonator with the structured first electrode,
   wherein the step d) is carried out such that the second part of the spacer layer has different first, second and third thicknesses in the respective openings such that the optical resonator allows, respectively, transmission of red, green and blue light from the white light emitted by the stack of organic light-emitting layers.

2. The method as claimed in claim 1, wherein step e) is carried out such that the second part of the spacer layer and the dielectric layer have a step height greater than or equal to 100 nm at the end of step e).

3. The method as claimed in claim 1, wherein step e) is carried out through chemical-mechanical polishing.

4. The method as claimed in claim 1, wherein the spacer layer formed in step d) comprises at least one oxide that is electrically conductive and transparent in the visible spectrum.

5. The method as claimed in claim 4, wherein the oxide or oxides are selected from among indium tin oxide, tin oxide SnO2 and zinc oxide ZnO.

6. The method as claimed in claim 1, wherein step d) is carried out such that the first thickness is 100 nm, the second thickness is 50 nm, and the third thickness is 10 nm.

7. The method as claimed in claim 1, wherein the openings formed in step c) have a width of between 500 nm and 10 μm.

8. The method as claimed in claim 1, wherein the dielectric layer formed in step b) is made of a material chosen from among SiO2 and SiN.

9. The method as claimed in claim 1, wherein the dielectric layer formed in step b) has a thickness of between 150 nm and 300 nm.

10. The method as claimed in claim 1, wherein the first and second electrodes are made of a metal material, preferably selected from among Al, Ag, Pt, Cr, Ni, W, and/or made of a transparent conductive oxide.

11. The method as claimed in claim 1, wherein:
   the substrate provided in step a) is transparent in the visible spectrum,
   the structured first electrode provided in step a) is semi-transparent in the visible spectrum,
   the second electrode formed in step g) is reflective in the visible spectrum.

12. The method as claimed in claim 1, wherein:
   the substrate provided in step a) is made of a semiconductor material, preferably silicon, or made of glass,
   the structured first electrode provided in step a) is reflective in the visible spectrum,
   the second electrode formed in step g) is semi-transparent in the visible spectrum.

* * * * *